United States Patent [19]

Wangler et al.

[11] Patent Number: 5,572,287

[45] Date of Patent: Nov. 5, 1996

[54] ILLUMINATING ARRANGEMENT FOR A PROJECTION MICROLITHOGRAPHIC EXPOSURE APPARATUS

[75] Inventors: Johannes Wangler, Königsbronn; Gerhard Ittner, Oberkochen, both of Germany

[73] Assignee: Carl-Zeiss-Stiftung, Heidenheim, Germany

[21] Appl. No.: 355,177

[22] Filed: Dec. 8, 1994

[30] Foreign Application Priority Data

Dec. 13, 1992 [DE] Germany .......................... 43 42 424.4
Jun. 17, 1994 [DE] Germany ............................ 9409744 U

[51] Int. Cl.⁶ ............................... G03F 7/20; G02B 19/06
[52] U.S. Cl. ............................................. 355/53; 355/67
[58] Field of Search ............................... 355/1, 53, 67, 355/70; 359/618, 619

[56] References Cited

U.S. PATENT DOCUMENTS

| 3,770,340 | 11/1973 | Cronin et al. . | |
|---|---|---|---|
| 5,208,629 | 5/1993 | Matsuo et al. | 355/53 |
| 5,357,311 | 10/1994 | Shiraishi | 355/53 |

FOREIGN PATENT DOCUMENTS

| 0266203 | 5/1988 | European Pat. Off. . |
| 0297161 | 1/1989 | European Pat. Off. . |
| 0343729 | 11/1989 | European Pat. Off. . |
| 0486316 | 5/1992 | European Pat. Off. . |
| 0486316 | 5/1992 | European Pat. Off. . |
| 0500393 | 8/1992 | European Pat. Off. . |
| 0496891 | 8/1992 | European Pat. Off. . |

OTHER PUBLICATIONS

"Effect of central obscuration on image formation in projection lithography" by S. T. Yang et al., SPIE, vol. 1264, Optical/Laser Microlithography III, (1990), pp. 477 to 485.

Primary Examiner—Joan H. Pendegrass
Attorney, Agent, or Firm—Walter Ottesen

[57] ABSTRACT

The invention is directed to an illuminating arrangement for selectively providing a projection microlithographic exposure apparatus with various types of illumination including conventional illumination having an adjustable coherence factor (σ), illumination via an annular aperture and symmetrically inclined illumination from two or four directions. The illuminating arrangement includes a light source for emitting light; a first light collecting device for collecting a first portion of the light in a first spatial angle region of the emitted light; a first shaping device for receiving and shaping the first portion of the light into a first shaped flux of light; a second light collecting device for collecting a second portion of the light in a second spatial angle region of the emitted light; a second shaping device for receiving and shaping the second portion of the light into a second shaped flux of light; an objective defining a pupillary plane and a reticle plane downstream of the pupillary plane; and, an imaging device for imaging images of the first and second shaped fluxes of light into sectors of the pupillary plane. The objective transmits the fluxes of light to the reticle plane and the illuminating arrangement also includes a first displacing device for operating on the first shaped flux of light so as to radially and azimuthally displace the image of the first shaped flux of light in the pupillary plane and a second displacing device for operating on the second shaped flux of light so as to radially and azimuthally displace the image of the second shaped flux of light in the pupillary plane.

13 Claims, 6 Drawing Sheets

ILLUMINATING ARRANGEMENT FOR A PROJECTION MICROLITHOGRAPHIC EXPOSURE APPARATUS

FIELD OF THE INVENTION

The invention relates to an illuminating arrangement for a Projection microlithographic exposure apparatus for selectively providing different types of illumination.

BACKGROUND OF THE INVENTION

European patent publications 0,486,316; 0,496,891; and, 0,500,393 as well as U.S. Pat. No. 5,208,629 disclose such illuminating arrangements for symmetrically inclined illumination with two or four light beams. In each case, displacement possibilities are provided. Thus, European patent publication 0,486,316 discloses shifting the geometry of the quadrupole illumination by displacing light conductors (FIGS. 12 and 13) or lenses (FIG. 17) or lens arrays (FIG. 35) and FIG. 38 shows the arrangement of various lens rasters on a turret with two and four light beams and a conventional simple light beam. This last configuration is also presented in claim 13 of European patent publication 0,496,891. According to claim 12 of this publication, angles and spacing of the quadrupole illumination are adjustable and in claim 14, a switchover electro-optical filter for defining the various types of illumination is presented. European patent publication 0,500,393 includes FIG. 16 which also shows a turret for different types of illumination.

The above-mentioned European patent publications provide that the light of a light source collected by a single collector is subdivided by known means into one, two or four light fluxes in order to obtain the desired number of secondary light sources.

Only European patent publication 0,500,393 provides, as an alternative, the arrangement of two lamps (FIG. 12). The light spots are always circular in shape or quadratic. U.S. Pat. No. 5,208,629 includes FIG. 80 which also presents four secondary light sources each having a shape corresponding to an annular segment but without providing information as to the generation or displacement thereof.

European patent publication 0,297,161 collects the light of a light source with two opposite-lying collectors and conducts the light via mirrors into the pupillary plane. Displacement possibilities and other than conventional illumination are not provided. The arrangement includes a glass rod and a special filter which can be mounted directly on the reticle or on the output of the glass rod.

None of the above publications makes any mention of the possibility of scanning when exposing with the exception of U.S. Pat. No. 5,208,629 wherein claims 16 and 62 disclose a rotating inclined illumination with a rotating light spot.

An arrangement of this kind is also disclosed in the article of S. T. Yang et al entitled "Effect of central obscuration on image formation in projection lithography" published in SPIE, Volume 1264, (1990), pages 477 to 485 and in U.S. Pat. No. 3,770,340 for coherent laser illumination and any desired imaging.

An illuminating arrangement for microlithography described in European patent application 0,266,203 provides for: splitting the light of a light source into several light fluxes, simultaneously scanning the light fluxes and the mutual superpositioning thereof (see the abstract and claim 1 of this publication). This operates to suppress disturbances caused by coherent light (see claim 2). Splitting the light into light fluxes takes place without loss by means of geometric light division (see FIGS. 4a to 4d).

SUMMARY OF THE INVENTION

It is an object of the invention to provide an illuminating arrangement for a projection lithographic exposure apparatus for selectively providing many various types of illumination including conventional illumination having an adjustable coherence factor σ, ring-aperture illumination and symmetrically inclined illumination from two or four directions which, for greater universality, make possible a high efficiency when utilizing the light source with good changeability without an exchange of parts and a good imaging quality.

The illuminating arrangement of the invention is for selectively providing a projection microlithographic exposure apparatus with various types of illumination including illumination having an adjustable coherence factor (σ), illumination via an annular aperture and symmetrically inclined illumination from two or four directions. The illuminating arrangement includes: a light source for emitting light; first light collecting means for collecting a first portion of the light in a first spatial angle region of the emitted light; first shaping means for receiving and shaping the first portion of the light into a first shaped flux of light; second light collecting means for collecting a second portion of the light in a second spatial angle region of the emitted light; second shaping means for receiving and shaping the second portion of the light into a second shaped flux of light; objective means defining a pupillary plane and a reticle plane downstream of the pupillary plane; imaging means for imaging images of the first and second shaped fluxes of light into sectors of the pupillary plane; the objective means including means interposed between the planes for transmitting the fluxes of light to the reticle plane; first displacing means for operating on the first shaped flux of light so as to radially and azimuthally displace the image of the first shaped flux of light in the pupillary plane; and, second displacing means for operating on the second shaped flux of light so as to radially and azimuthally displace the image of the second shaped flux of light in the pupillary plane.

On the one hand, it is not necessary to have changeable optical elements in sliders, turrets or the like which only allow for a narrowly limited selection or which require extensive retrofitting and, on the other hand, the light source for all types of illumination is well utilized.

The annular segment shape of the light flux already permits with tighter positioning the classic illumination by means of pure radial displacement in addition to an exact annular aperture illumination, possibly with a small central obscuration for light fluxes which overlap partially in the pupillary plane and for a wide positioning, the symmetrically inclined illumination is provided. Symmetrically inclined illumination is usually made with circular-shaped secondary light sources but the form is of no consequence. In this connection, reference may be made to U.S. Pat. No. 5,208,629 wherein secondary light sources shaped as annular segments are shown.

A laser, which is combined with a beam splitter, is also suitable as a light source.

BRIEF DESCRIPTION OF THE DRAWINGS

The invention will now be described with reference to the drawings wherein.

DESCRIPTION OF THE PREFERRED EMBODIMENTS OF THE INVENTION

Figure 1A:
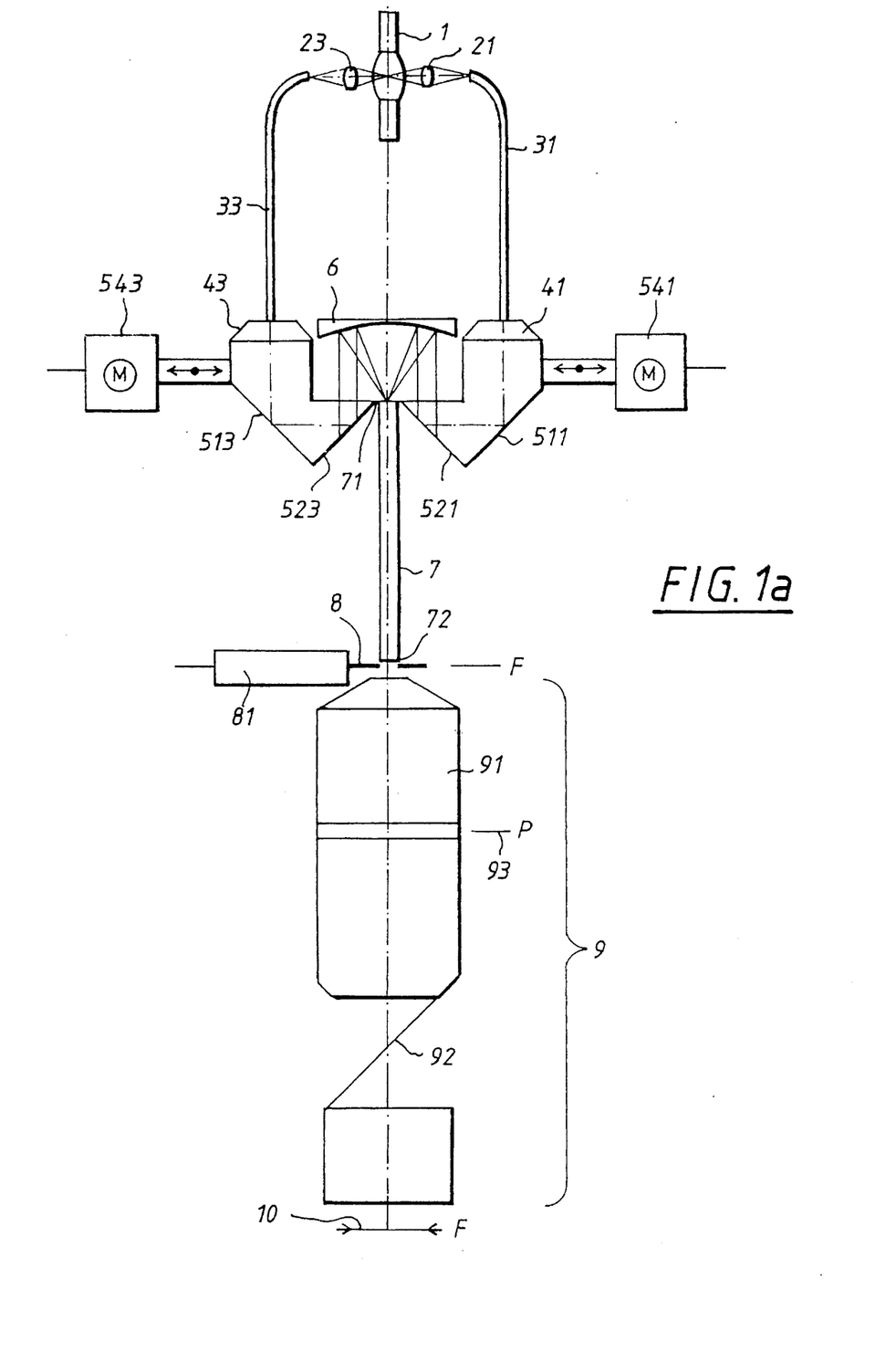
FIG. 1a is a side elevation schematic of an embodiment of an illuminating arrangement according to the invention.
Figure 1B:
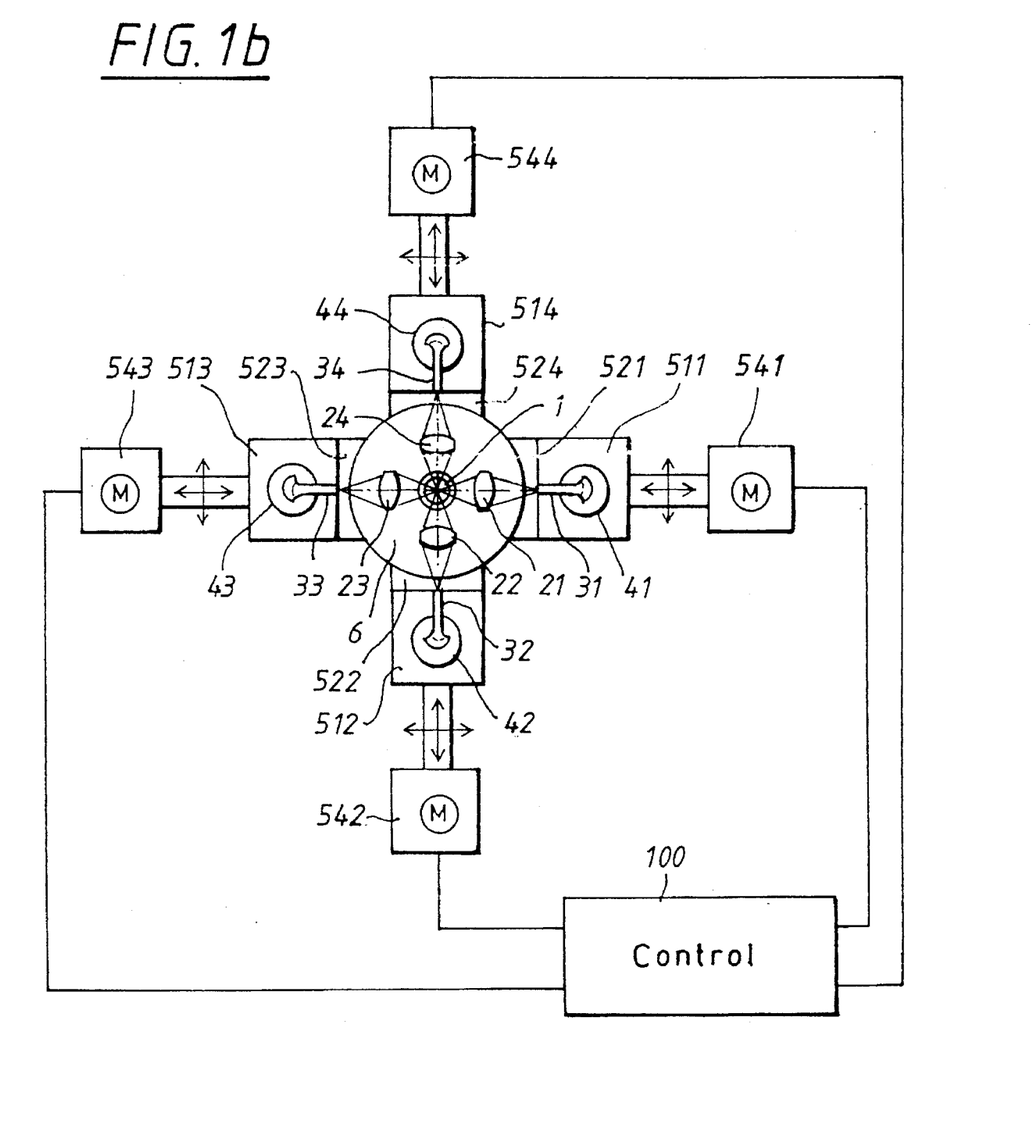
FIG. 1b shows the illuminating arrangement of FIG. 1a in plan view.
Figure 1C:
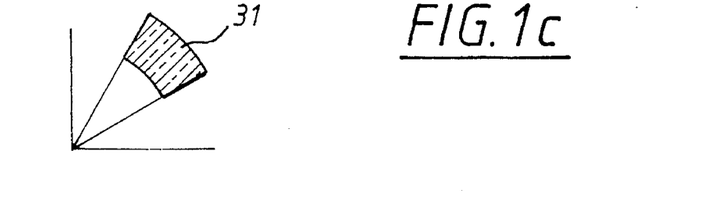
FIG. 1c is a section view of the exit surface of the light conductor shown in FIGS. 1a and 1b.

FIGS. 1a and 1b show a mercury short-arc lamp as light source 1. This light source 1 emits a flux of light and four collectors (21 to 24) each collect a large spatial angle region thereof so that most of the light is supplied to the four light conductors (31 to 34). The light conductors (31 to 34) are configured as cross-sectional converters having exit faces having a ring-segment shape as shown in FIG. 1c. The light conductors (31 to 34) are, for example, made up of statistically mixed individual fibers for substantially homogenizing the light intensity over the exit faces. The input cross section can also be adapted to the light distribution.

Alternatively, the illumination of the light conductors (31 to 34) can also be realized by a laser having a beam widening optic and a pyramidal mirror as a geometric beam splitter. The laser is then, for example, an excimer laser emitting in the ultraviolet range.

Four units are directly downstream of respective ones of the exit faces of the four light conductors (31 to 34). Each of the units includes a relay optic (41, 42, 43 or 44), a first deflection mirror (511, 512, 513 or 514) and a second deflection mirror (521, 522, 523 or 524). These units including the connected ends of the flexibly configured light conductors (31 to 34) are each radially and azimuthally displaceable or scannable by means of positioning drives (541 to 544). A control unit 100 controls the positioning drives (541 to 544).

The light coming from the four deflection mirrors (521 to 524) is imaged on the entry face 71 of a glass rod 7 via the in-coupling mirror 6. This entry face 71 lies in a pupillary plane P of the illuminating arrangement and each of the four units can illuminate a quadrant of this entry face according to the position of the position drives (541 to 544). The four light fluxes gathered by the collectors (21 to 24) are here geometrically assembled to provide an effective secondary light source.

A field plane F is located at the exit face 72 of the glass rod 7 and a reticle masking system 8 is mounted in the field plane F. The reticle masking system is an adjustable diaphragm. The reticle masking system is displaced as required utilizing positioning means 81.

Providing the reticle masking system 8 at this location is less complex compared to known solutions because it is not necessary to provide an additional field plane just for the reticle masking system.

The downstream intermediate system 9 is an objective defining a pupillary plane (P) 93. This system 9 comprises an intermasking device 91 upstream of the pupillary plane (P) and a beam deflector 92 downstream thereof. The beam deflector 92 is symbolically represented and comprises a planar mirror which, in a manner known per se, makes possible a compact overall assembly. The reticle 10 to be illuminated follows in field plane F'. The pupillary plane 93 is fourier transformed to the reticle or field plane F'.

The projection objective downstream of the field plane F' and the wafer to be exposed are known per se and therefore not illustrated.

Numerical aperture and imaging scale of the projection objective or, more specifically, the size of its pupil are, however, decisive for the geometric data of the illuminating arrangement and therefore determine the required region of the numerical aperture.

Figure 2:
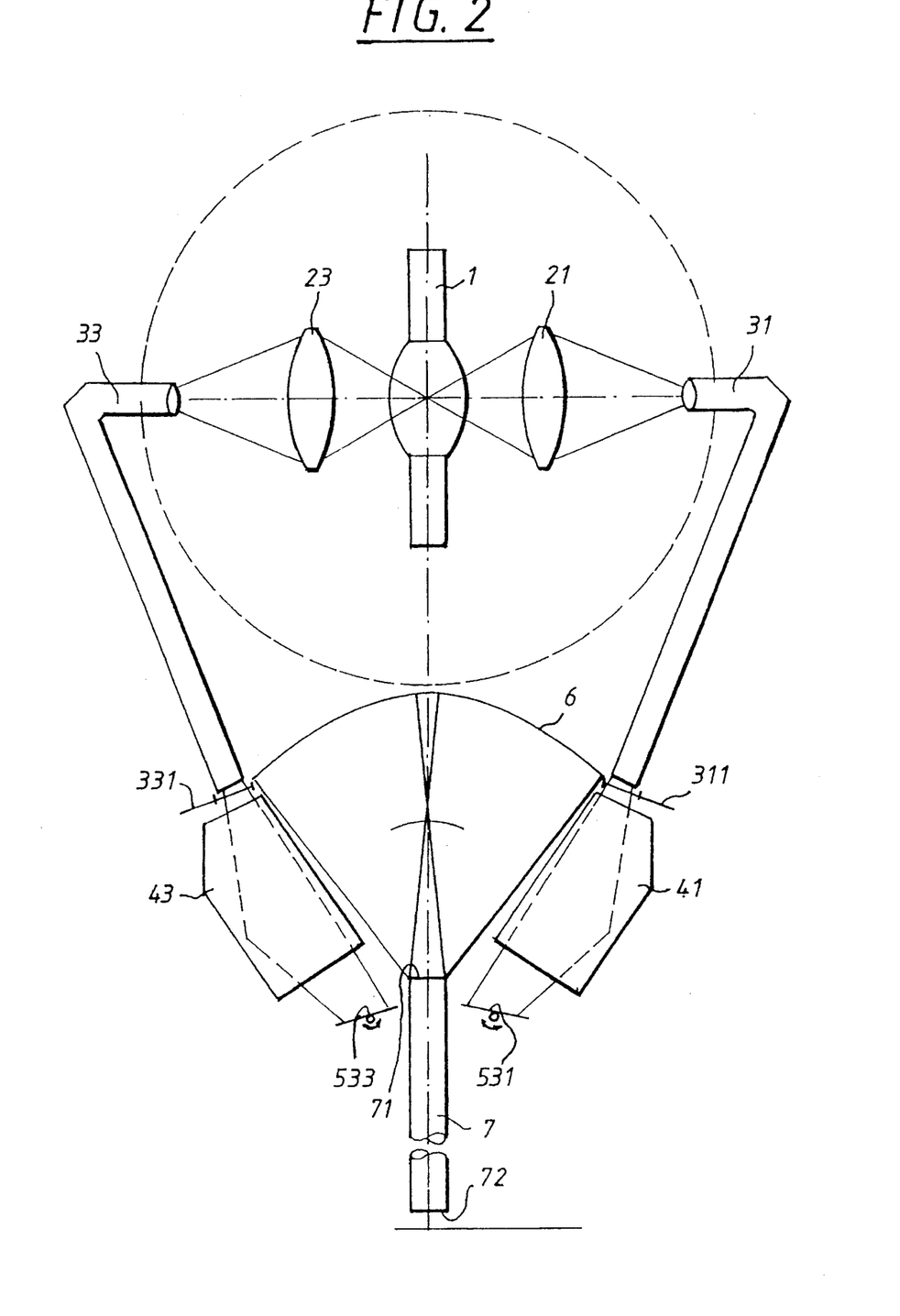
FIG. 2 is a side elevation schematic of a second embodiment of the illuminating arrangement according to the invention.

FIG. 2 shows another embodiment of the assembly group mounted forward of the glass rod 7. Light source 1 and collectors (21, 23) are configured as above. The light conductors (31, 33) are rigid and are, for example, glass rods. Shutters (311, 331) are provided at their respective ends and are followed by respective relay optics (41, 43).

The scanning mirrors (531, 533) are mounted at the location of the rear aperture of the relay optics (41, 43) and are each configured as one piece and so as to be small and light.

The scanning mirrors (531, 533) are azimuthally rotatable about the axis of symmetry of the arrangement, that is, the optical axis of the glass rod 7, and can be tilted about their respective center axes perpendicular to the plane of the drawing. An in-coupling mirror 6 has quadrants configured as may be required and, in turn, images onto the entry face 71 of the glass rod 7.

The simple and light configuration of the scanning mirrors (531, 533) makes them suitable for a rapid scanning. The drive units for these scanning mirrors are not shown as their configuration is known per se.

In addition to the two groups shown in FIG. 1a for generating two secondary light sources, two further groups at 90° relative to the first two groups can be provided as shown in FIG. 1b. The form of the secondary light sources is fixed according to the requirement and generated by the form of the light conductors (31, 33).

The illuminating arrangement according to the invention as shown in FIGS. 1a, 1b and FIG. 2, as well as many departures from these embodiments, has as a decisive characteristic that secondary light sources of the most varied form and dimension can be generated in the pupillary plane 93 of the intermediate imaging system 9, that is, in combination of the form (especially annular segmented form) of the light flux generated at the output of the light conductors (31 to 34) and provided in each quadrant (or in each half circle where only two component systems are provided). Each of the segmented forms can be radially and azimuthally displaced via positioning drives (541 to 544) and the displacement can be adjusted as desired by the control unit 100.

The displacement (scanning) can also take place during the exposure.

Many different types of illumination with a continuous displacement of the parameters can be generated without any exchange or retrofit of parts whereby the illuminating arrangement is, for example, also especially suitable for experimental optimization of the exposing method.

Figure 3A:
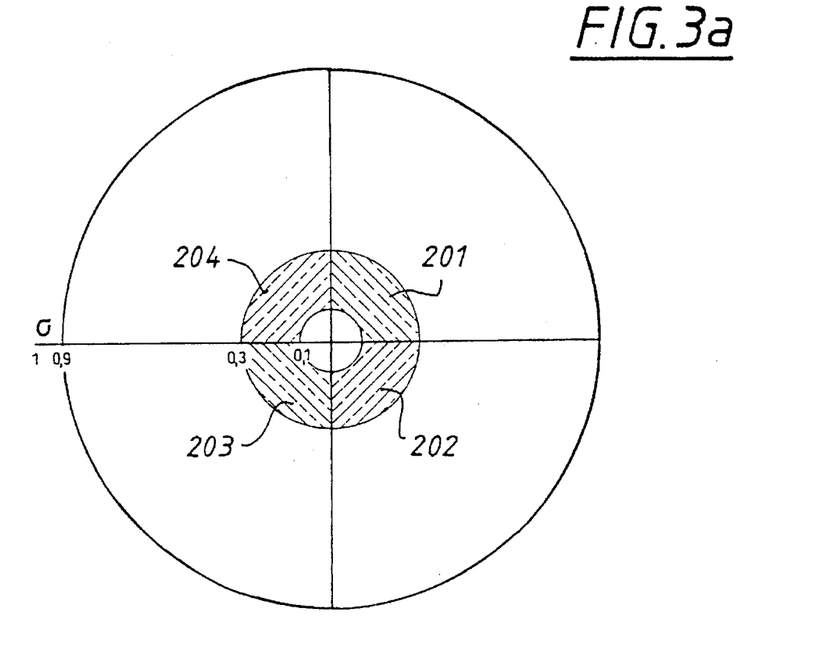
FIG. 3a shows the secondary light source in the pupillary plane of the intermediate imaging system to provide a conventional illumination.
Figure 3B:
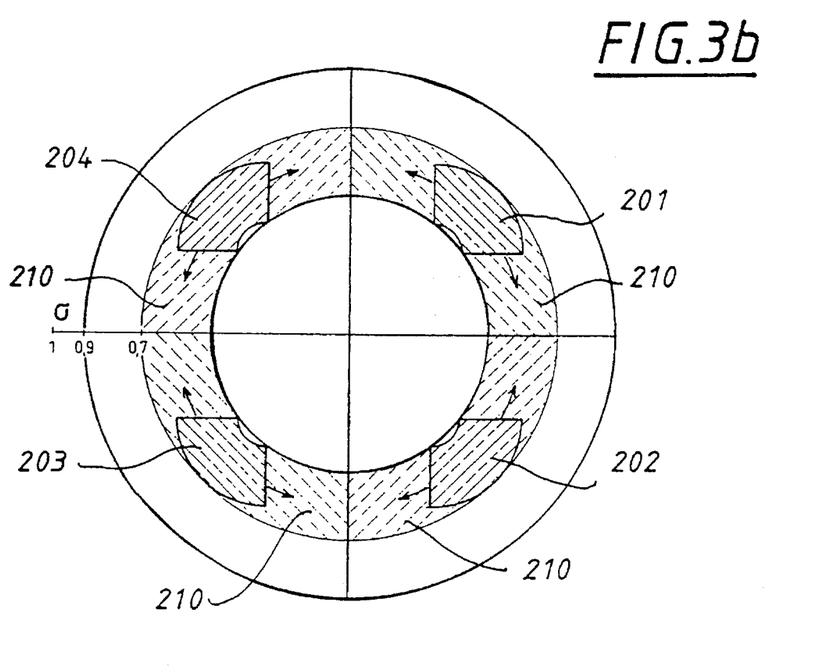
FIG. 3b corresponds to FIG. 3a except that an annular aperture illumination is shown.
Figure 3C:
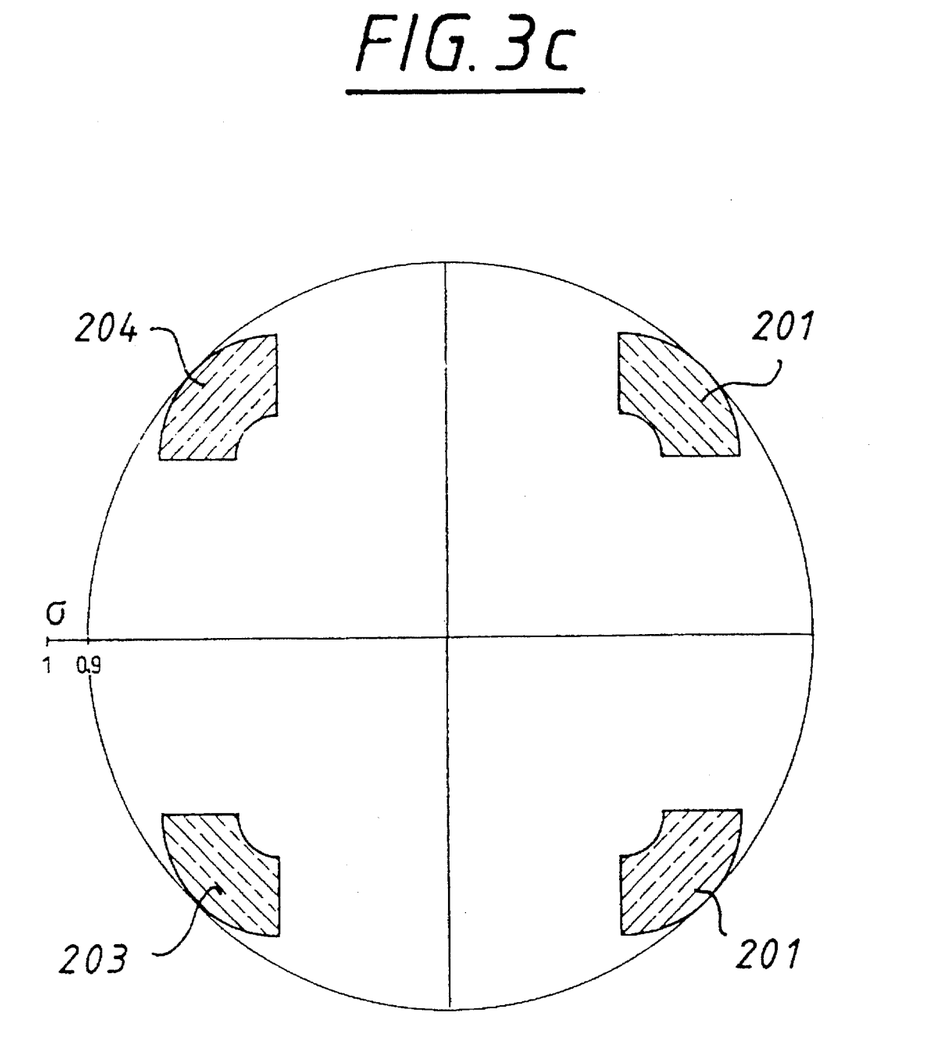
FIG. 3c shows the secondary light sources in the pupillary plane of the intermediate imaging system wherein the illumination is in the form of a quadrupole illumination; and, FIG. 4 is a side elevation view of a third embodiment of the illuminating arrangement according to the invention.

FIGS. 3a to 3c are examples thereof. FIGS. 3a to 3c show the light beams in the pupillary plane 93. The relative radius σ is shown referred to the radius of the pupil of the projection objective while considering the imaging scale. σ is also identified as the degree of coherence of illumination.

FIG. 3a shows a classic illumination having the relatively low σ=0.3 and a central obscuration of 0.1. The central masking is often wanted in order to provide central adjusting beam paths and measuring beam paths.

The secondary light source is composed of the components of the four quadrants in which respective ring-segment shaped light spots (201 to 204) lie as images of the correspondingly shaped ends of the light conductors (31 to 34). The ring-segmented shaped light spots (201 to 204) have an inner radius corresponding to σ=0.1 and an outer radius corresponding to σ=0.3 as well as an azimuthal angle of 90°. A conventional illumination is so directly generated without a scanning movement wherein much light of the light source 1 is collected and no light is unnecessarily masked.

FIG. 3b corresponds to FIG. 3a and shows a ring-aperture illumination. The same light spots (201 to 204) are now shifted radially outwardly and are scanned azimuthally, that is, they are moved over their respective quadrants 210 during the exposure time so that, in time average, a ring-aperture illumination is generated. The ring-aperture illumination has an azimuthal homogeneity which can be influenced by the course of the scanning movement.

It is immediately apparent that a classic illumination having a large σ (for example, 0.5 to 0.7) can be attained from the combination of the illumination of FIGS. 3a and 3b when a radial displacement and an azimuthal scan are combined within the exposure time. A ring-aperture illumination having a greater difference between inner and outer radii also becomes possible in this manner.

FIG. 3c is an example for providing symmetrically inclined illumination configured as quadrupole illumination. In its simplest form, this quadrupole illumination proceeds from the annular aperture illumination of FIG. 3b by omitting the azimuthal movement. Typically, light spots (the largest σ≈0.9) close to the periphery are required. The precise form of the light spots is not significant for quadrupole illumination (see U.S. Pat. No. 5,208,629). The size and the form of the quadrupole light spots can, however, be adapted to the requirements by radial and azimuthal movement during the exposure time.

Reference is also made to the possibility of realizing a dipole illumination without loss in that each two mutually adjacent light spots (201, 202) and (203, 204) are positioned azimuthally at the boundary of the quadrants so that they are united.

The form of the light spots (201 to 204) shown is an advantageous embodiment which can be varied as desired. It is also possible to influence their forms by additional diaphragms and especially by shutters (311 to 341) even though light losses must be accepted thereby.

The annular segment form is especially adapted to the geometry of the illuminating arrangement because it provides a uniformly radial light distribution in the light spot for the average radius of the secondary light source which, at the same time, is the average radius of the annular segments. Also for other positions, the light distribution is still more uniform than, for example, with a scanned round spot (which is not very small). A classic illumination without scanning can then be precisely realized.

A glass rod 7 is better suited as a light mixing device for an arrangement of the invention than a honeycomb condenser because its narrower cross section permits a more compact assembly. In this context, reference can be made to FIG. 2 wherein the scanning mirrors (531, 533) are mounted next to the glass rod 7.

Compactness with good quality is provided when a reticle masking system 8 is realized in a field plane directly rearward of the glass rod 7 instead of, as conventionally, in an intermediate field plane especially provided therefor.

The control unit 100 (see FIG. 1b) for the positioning drives (541 to 544) of the radial and azimuthal movement is advantageously integrated into the control of the system and generates the pregiven optimal sequences of the generation of the secondary light sources (program controlled) in dependence upon the structure of the particular reticles.

Figure 4:
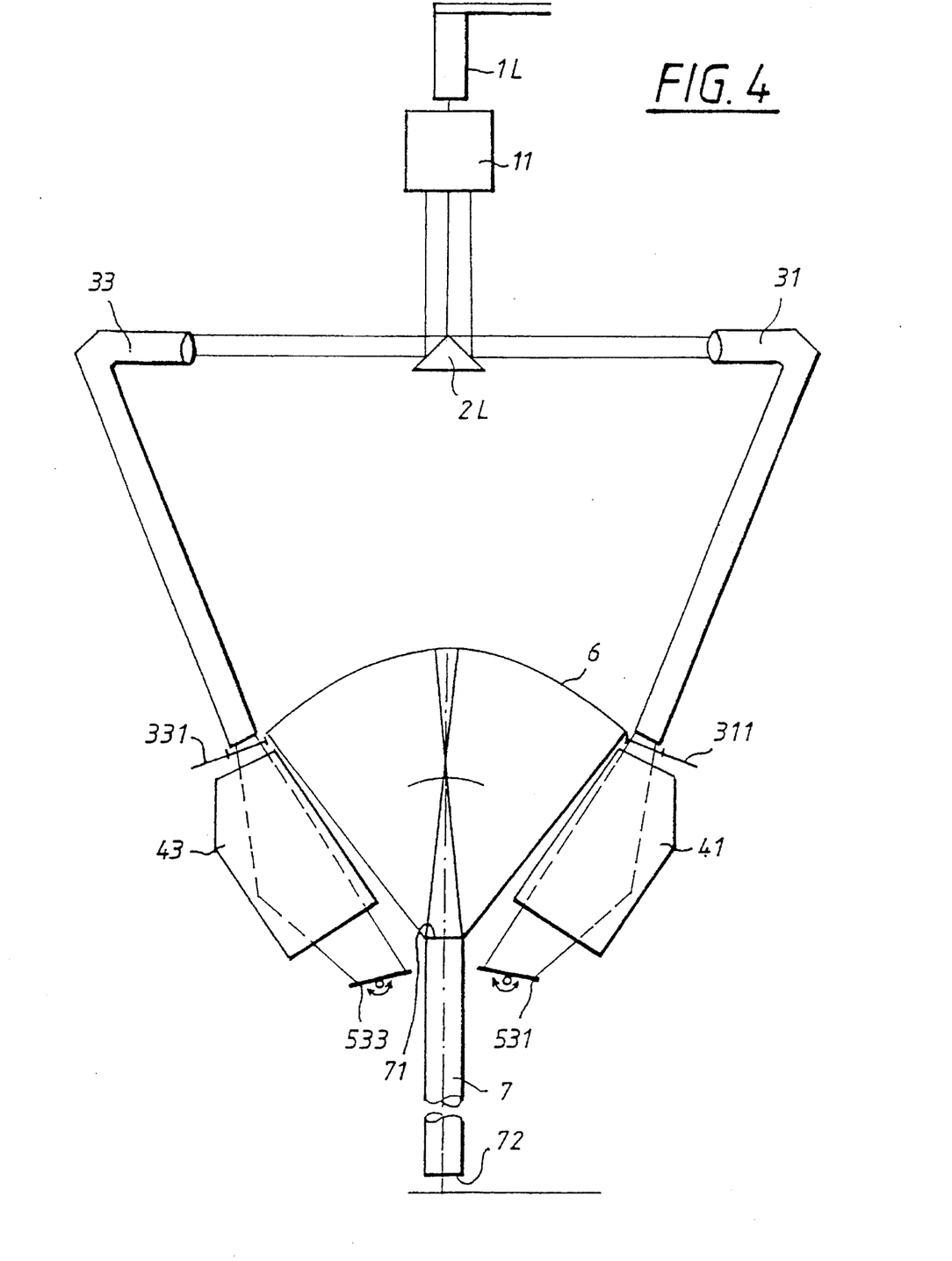

FIG. 4 shows a variation of the embodiment of FIG. 2. In the embodiment of FIG. 4, the light source is a laser (1L) and a Galilei telescope 11 is provided for widening the light beam. Collecting means in the form of a geometric beam splitter (2L) is formed as a roof-edged mirror and divides the laser beam into two light beams. These beams are fed into the light conductors (31, 33) as shown in FIG. 2 and into the remaining downstream components of the arrangement. In this way, the illuminating arrangement is easily adapted to a laser light source or any other collimated light source. Additional discrete light beams, such as four, are easily obtained by adding more beam splitters.

It is understood that the foregoing description is that of the preferred embodiments of the invention and that various changes and modifications may be made thereto without departing from the spirit and scope of the invention as defined in the appended claims.

What is claimed is:

1. An illuminating arrangement for selectively providing a projection microlithographic exposure apparatus with various types of illumination including illumination having an adjustable coherence factor (σ), illumination via an annular aperture and symmetrically inclined illumination from two or four directions, the illuminating arrangement comprising:

a light source for emitting light;

first light collecting means for collecting a first portion of said light in a first spatial angle region of the emitted light;

first shaping means for receiving and shaping said first portion of said light into a first shaped flux of light;

second light collecting means for collecting a second portion of said light in a second spatial angle region of the emitted light;

second shaping means for receiving and shaping said second portion of said light into a second shaped flux of light;

objective means defining a pupillary plane and a reticle plane downstream of said pupillary plane;

imaging means for imaging images of said first and second shaped fluxes of light into sectors of said pupillary plane;

said objective means including means interposed between said planes for transmitting said fluxes of light to said reticle plane;

first displacing means for operating on said first shaped flux of light so as to radially and azimuthally displace the image of said first shaped flux of light in said pupillary plane; and, second displacing means for operating on said second shaped flux of light so as to radially and azimuthally displace the image of said second shaped flux of light in said pupillary plane.

2. The illuminating arrangement of claim 1, said first and second shaping means for shaping said portions of light including first and second light conductors, respectively.

3. The illuminating arrangement of claim 2, said first and second light conductors having first and second outputs, respectively; said first displacing means being operatively connected to said first light conductor to displace said first output; and, said second displacing means being operatively connected to said second light conductor to displace said second output.

4. The illuminating arrangement of claim 1, said imaging means including first and second displaceable reflecting units for reflecting said first and second shaped fluxes of light, respectively; and, said first and second displacing means operatively connected to said first and second reflecting units, respectively, for displacing said reflecting units.

5. The illuminating arrangement of claim 1, further comprising a glass rod disposed between said imaging means and said reticle plane.

6. The illuminating arrangement of claim 5, said glass rod having an exit face and said illuminating arrangement further comprising a variable masking system mounted close to said exit face.

7. The illuminating arrangement of claim 1, wherein said images of said first and second shaped fluxes of light are so dimensioned in said pupillary plane that said images are suitable for said symmetrically inclined illumination or for said illumination having an adjustable coherence factor $\sigma \geq 0.1$.

8. The illuminating arrangement of claim 1, further comprising means for changing the size of said images of said first and second fluxes of light in said pupillary plane.

9. The illuminating arrangement of claim 1, further comprising means for changing the shape of said fluxes of light.

10. The illuminating arrangement of claim 1, further comprising means for shaping said fluxes of light to have cross sections in the form of annular segments.

11. The illuminating arrangement of claim 1, said light source being a laser and said first and second collecting means conjointly defining a beam splitter.

12. The illuminating arrangement of claim 4, said first and second displacing means being adapted to cause said first and second displaceable reflecting units to execute respective scanning movements to sequentially generate said images in said pupillary plane.

13. A quadrupole illuminating arrangement for selectively providing a projection microlithographic exposure apparatus with various types of illumination including illumination having an adjustable coherence factor ($\sigma$), illumination via an annular aperture and symmetrically inclined illumination from two or four directions, the quadrupole illuminating arrangement comprising:

a light source for emitting light;

first light collecting means for collecting a first portion of said light in a first spatial angle region of the emitted light;

first shaping means for receiving and shaping said first portion of said light into a first shaped flux of light;

second light collecting means for collecting a second portion of said light in a second spatial angle region of the emitted light;

second shaping means for receiving and shaping said second portion of said light into a second shaped flux of light;

third light collecting means for collecting a third portion of said light in a third spatial angle region of the emitted light;

third shaping means for receiving and shaping said third portion of said light into a third shaped flux of light;

fourth light collecting means for collecting a fourth portion of said light in a fourth spatial angle region of the emitted light;

fourth shaping means for receiving and shaping said fourth portion of said light into a fourth shaped flux of light;

objective means defining a pupillary plane and a reticle plane downstream of said pupillary plane;

imaging means for imaging images of said first, second, third and fourth shaped fluxes of light into sectors of said pupillary plane;

said objective means including means interposed between said planes for transmitting said fluxes of light to said reticle plane;

first displacing means for operating on said first shaped flux of light so as to radially and azimuthally displace the image of said first shaped flux of light in said pupillary plane;

second displacing means for operating on said second shaped flux of light so as to radially and azimuthally displace the image of said second shaped flux of light in said pupillary plane;

third displacing means for operating on said third shaped flux of light so as to radially and azimuthally displace the image of said third shaped flux of light in said pupillary plane; and, fourth displacing means for operating on said fourth shaped flux of light so as to radially and azimuthally displace the image of said fourth shaped flux of light in said pupillary plane.

\* \* \* \* \*